United States Patent [19]

Dessaux et al.

[11] Patent Number: 5,897,913
[45] Date of Patent: Apr. 27, 1999

[54] METHOD FOR APPLYING A PROTECTIVE COATING TO THE COMPONENTS OF A PRINTED CIRCUIT BOARD

[75] Inventors: Christophe Dessaux, Lafrancaise; Emmanuel Moreau, Toulouse, both of France

[73] Assignee: Giat Industries, Versailles, France

[21] Appl. No.: 08/860,421

[22] PCT Filed: Oct. 18, 1996

[86] PCT No.: PCT/FR96/01630

§ 371 Date: Jun. 24, 1997

§ 102(e) Date: Jun. 24, 1997

[87] PCT Pub. No.: WO97/16055

PCT Pub. Date: May 1, 1997

[30] Foreign Application Priority Data

Oct. 25, 1995 [FR] France ................................. 95 12595

[51] Int. Cl.⁶ .................................................. B05D 5/12
[52] U.S. Cl. ............................ 427/96; 427/421; 427/426
[58] Field of Search ................................. 257/723, 787; 361/760, 818; 427/96, 372.2, 384, 421, 424, 426, 256, 283, 8

[56] References Cited

U.S. PATENT DOCUMENTS

| | | | |
|---|---|---|---|
| 3,440,086 | 4/1969 | Kerns ........................................ | 427/426 |
| 4,317,158 | 2/1982 | Dequasie ................................. | 361/272 |
| 4,533,598 | 8/1985 | Downey et al. ......................... | 428/380 |
| 4,970,575 | 11/1990 | Soga et al. ............................... | 357/72 |
| 5,043,221 | 8/1991 | Koleske .................................. | 428/413 |
| 5,330,101 | 7/1994 | Turner et al. . | |

FOREIGN PATENT DOCUMENTS

| | | |
|---|---|---|
| A-01-138220 | 5/1989 | Japan . |
| A-04-365394 | 12/1992 | Japan . |
| A-95 15579 | 6/1995 | WIPO . |

OTHER PUBLICATIONS

Electronic Packaging Production, vol. 30, No. 4, Apr. 1990, Massachusetts, US, pp. 39–40, XP000117358 Engineer's Fact File: "Conformal coating materials".

*Primary Examiner*—Brian K. Talbot
*Attorney, Agent, or Firm*—Oliff & Berridge, PLC

[57] ABSTRACT

Method for applying a protective coating to the components on a printed circuit board, said coating being comprised of a polymerizable material such as a resin, characterized in that it consists in preparing the material of which the coating is composed from an initial mixture of at least two ingredients (A, B) and adding to this initial mixture at least one third ingredient (C) in a variable quantity in order to vary the viscosity of the initial mixture according to the type of component to be protected during the coating of the printed circuit board components.

10 Claims, 1 Drawing Sheet

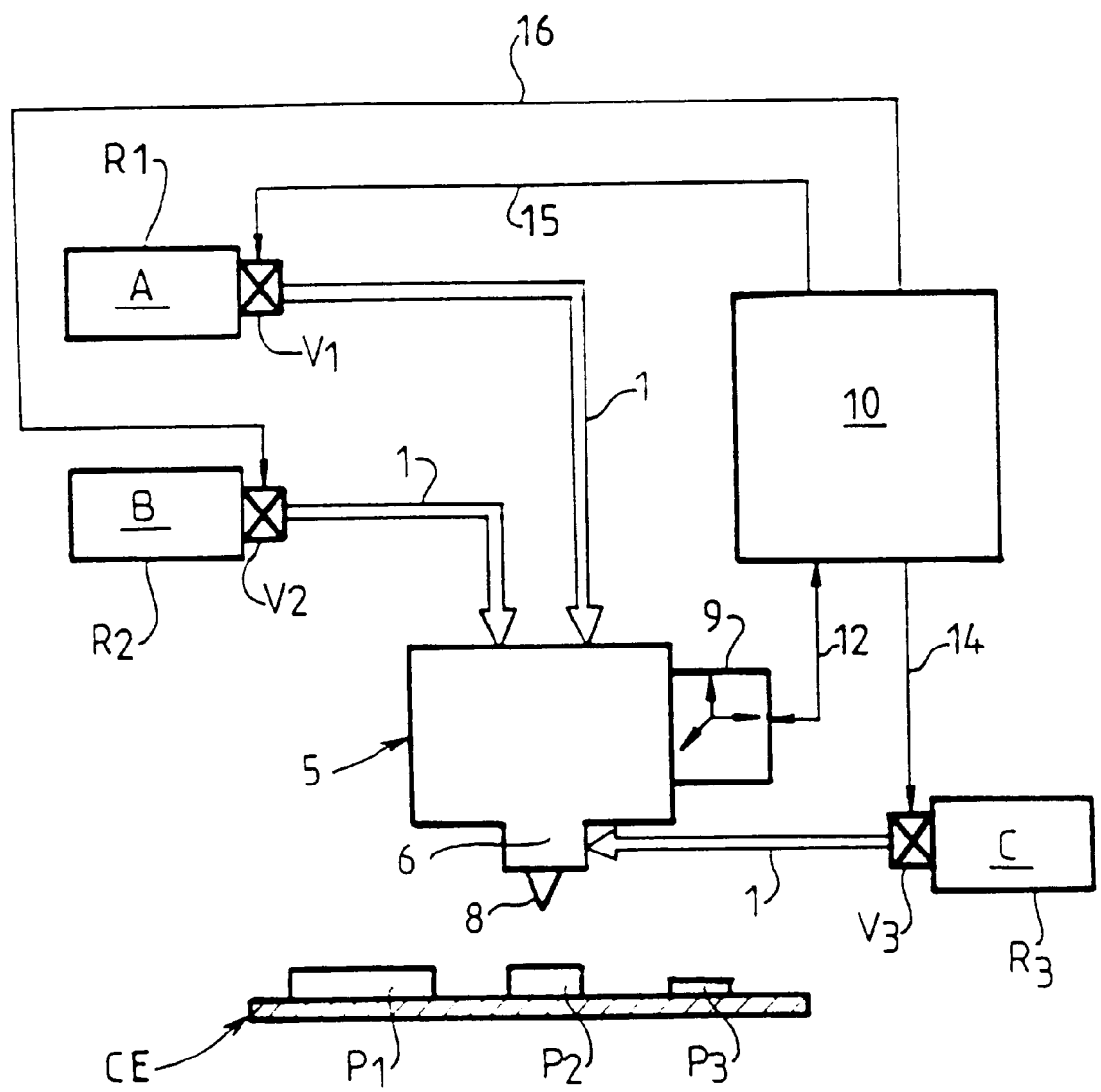

METHOD FOR APPLYING A PROTECTIVE COATING TO THE COMPONENTS OF A PRINTED CIRCUIT BOARD

BACKGROUND OF THE INVENTION

The present invention relates to a method for applying a protective coating to the components of a printed circuit board, said coating being comprised of a polymerizable material such as a resin.

Protection of components of printed circuit boards used in a harsh environment (temperature, moisture, impacts, vibrations, etc.) by applying to them a coating comprised of a polymer resin is known. Such an operation is often called "varnishing" or "tropicalization" of boards.

In general, a protective coating is made of a single layer of resin applied by sprinkling, or by spraying, or by dipping the board in a liquid resin bath.

However, the protection provided by this resin layer often proves to be inadequate. The complexity of printed circuit boards, due to the presence of active and/or passive components of highly variable size and fragility such as connectors, the various housings of electronic or integrated-circuit components, etc. requires protective coatings of different types depending on the type of component in question. To accomplish this, different molds and different types of resins have to be made for selectively applying an appropriate coating to each type of board component. Specifically, connectors require a coating based on a viscous resin for impact strength in particular, while components of SMD (surface mounted device) housings require protection against moisture for example by means of a highly fluid resin for small housings or a semi-viscous resin for larger housings. As a result, protection of the various components on a single printed circuit board requires production of a resin-holding mold for each component type so that the resin is applied selectively without flowing beyond the component to be protected.

This being the case, protection of the components on a printed circuit board requires prior fabrication of several molds and a coating operation for each mold used. Implementation is lengthy and complex, resulting in very high manufacturing costs.

SUMMARY OF THE INVENTION

The goal of the invention is to remedy these drawbacks and, for this purpose, the invention provides a method for applying a protective coating to the components on a printed circuit board, characterized in that it consists in preparing the material of which the coating is composed from an initial mixture of at least two ingredients and adding to this initial mixture at least one third ingredient in a variable quantity in order to vary the viscosity of the initial mixture according to the type of component to be protected during the coating of the printed circuit board components.

According to another characteristic of the method according to the invention, the two ingredients of the initial mixture are an isocyanate and a polyol, with these two ingredients reacting with one another to form a resin.

According to another characteristic of the invention, the third ingredient for varying the viscosity of the initial mixture is a thixotropic agent or a catalyst.

In general, the method according to the invention consists in producing the initial mixture in a mixing unit equipped with an ejection nozzle and, according to another go characteristic of the method, the third ingredient is advantageously added to the initial mixture in an output chamber of the unit that communicates with the ejection nozzle, the protective coating then being ejected from the nozzle and being applied selectively to the various components, depending on the viscosity required for each type of board component, by displacing the nozzle relative to the board or vice versa.

According to one important advantage of the invention, it is possible to coat the components on a printed circuit board with a protective coating made from one and the same initial mixture whose viscosity can be varied according to the type of component to be protected, using a single apparatus which, in a single operation or pass, is capable of coating all the components to be protected that protrude on at least one side of the printed circuit board.

According to another advantage of the invention, the apparatus required for implementing the method can be designed totally independently from the individual features of each printed circuit board, in particular the dimensions of the board and the number of components it supports.

According to yet another advantage of the invention, the apparatus required for implementing the method is considerably less expensive than that used in the prior art.

Other advantages, characteristics, and details of the invention will emerge from the explanatory description hereinbelow with reference to the attached drawing that schematically illustrates the principle of the method according to the invention.

BRIEF DESCRIPTION OF THE FIGURE

FIG. 1 shows an apparatus for applying a protective coating to the components of a printed circuit board.

DESCRIPTION OF THE PREFERRED EMBODIMENT

Protection of the components on a printed circuit board envisaged according to the invention consists in applying, at least to each of the components, a coating formed from an initial mixture of at least two ingredients to obtain a polymerizable material such as a resin.

This initial mixture is formed from a first ingredient A such as an isocyanate and a second ingredient such as a polyol. These two ingredients A and B react with each other to form a resin with a certain viscosity. As an example, the isocyanate is of the toluene isocyanate type or the diphenylmethane-4,4'diisocyanate type and the polyol used is of the polyether-polyol or polyester-1-polyol type.

At least a third ingredient C is added to this initial mixture, said ingredient being intended to vary the viscosity of the initial mixture and being a thixotropic agent or a catalyst. As an example, the thixotropic used is a 2,4-bis(p-aminobenzyl)aniline and the catalyst used is an organometallic compound such as a dibutyltin dilaurate Specifically, with reference to the attached drawing, the two ingredients A and B of the initial mixture and the third ingredient C intended to vary the viscosity of this initial mixture are stored in three reservoirs R1, R2, and R3, respectively.

The two reservoirs R1 and R2 are connected by a tube 1 to a mixing unit 5 where they are mixed. Mixing unit 5 advantageously has an output chamber 6 that is in communication with an ejection nozzle 8. The third reservoir R3 is connected by a tube 1 to output chamber 6 of mixing unit 5 to vary the viscosity of the initial mixture just before its ejection through nozzle 8. Mixing unit 5 is for example displaceable in three directions so that it can move relative to printed circuit board CE which remains fixed. The means for displacing mixing unit 5 are illustrated schematically and numbered 9.

A processing and control unit comprised of a programmable robot 10 is connected by electrical conductors 12 to displacing means 9 to transmit control commands and thus displace unit 5 in three directions relative to board CE. In addition, this robot 10 is connected by electrical conductors 14 to a valve V3 located at the outlet of reservoir R3 to control the quantity of third ingredient C which is introduced into mixing unit 5 to vary the viscosity of initial mixture A+B as it leaves nozzle 8, depending on the type of component to be protected during a given operation protecting all the components on board CE.

Robot 10 can also be used to control the quantities of the two ingredients A and B introduced into mixing unit 5. For this purpose, electrical conductors 15 and 16 connect the robot to two valves V1 and V2 mounted at the outlets of the two reservoirs R1 and R2, respectively.

Specifically, the three components P1, P2, and P3 to be protected on a printed circuit board CE are a connector, a medium-sized SMD housing, and a small SMD housing. Robot 10 is programmed to protect these three components in a preset order which for example is a function of the viscosity of the coating specific to each component type and the desired protection. The order chosen is for example P1, P2, then P3 in order to apply a coating of the viscous, semi-viscous, then fluid type from the same initial mixture whose viscosity is varied as ejection nozzle 8 moves.

In general, depending on the viscosity desired, the third ingredient C is added to initial mixture A+B in proportions by volume such that A+B is approximately 99.9 to 90% and C is approximately 0.1 to 10%. As an example, protection of connector P1 against impacts or vibrations requires a coating with a viscosity greater than 70,000 mpa.s, moisture protection of the medium-sized SMD housing or component P2 will require a coating with a viscosity of 5000 to 70,000 mPa.s, and moisture protection of the small SMD housing or component P3 will require a coating with a viscosity of less than 5000 mPa.s. These values are provided for a one-kilogram mixture at a temperature of 22° C.

Robot 10 is able automatically to program variations in viscosity of the initial mixture in output chamber 6 of mixing unit 5 before ejecting it through nozzle 8 to apply a protective coating to each type of component during a given operation.

Thus, depending on the type of component to be protected on printed circuit board CE, the viscosity of the coating can be varied as nozzle 6 moves over board CE. advantageously, when the coating is applied in the liquid form to a component of the board, this component can first be surrounded by a dam of viscous coating to prevent the coating from flowing beyond the component.

Once all the components on one side of printed circuit board CE are coated with a protective coating, board CE is placed in an oven to polymerize the coating. Thereafter, any components located on the other side of the printed circuit board are protected after said board has been turned over. In general, the printed circuit board is advantageously protected on each of its two sides so that it is entirely coated with a protective coating. To protect each end edge of the board or field of the board, a protective dam can be applied to the periphery of one side of the board with a viscosity such that the dam can overflow or slump to cover the field of the board.

We claim:

1. A method for applying a protective coating to varying component types on a printed circuit board with a single apparatus in a single pass, said coating being comprised of a polymerizable material, the method comprising the steps of:

preparing an initial coating material mixture of at least two ingredients in a mixing unit of the single apparatus equipped with an ejection nozzle;

adding to the initial mixture at least one third ingredient in a variable quantity in order to vary a viscosity of the initial mixture according to a first type of component on the printed circuit board to be protected to form a first protective coating, the at least one third ingredient being added to the initial mixture in an output chamber of the mixing unit, the output chamber communicating with the nozzle;

coating the first type of component on the printed circuit board with the first protective coating by ejecting the first protective coating from the nozzle during a first pass of the single apparatus;

adding to the initial mixture said at least one third ingredient in a variable quantity in order to vary the viscosity of the initial mixture according to a second type of component located on the printed circuit board to be protected to form a second protective coating differing in viscosity from the first protective coating, said at least one third ingredient being added in the output chamber; and coating the second type of component on the printed circuit board with the second protective coating by ejecting the second protective coating from the nozzle during the first pass of the single apparatus across the printed circuit board.

2. The method according to claim 1, characterized in that it comprises using an isocyanate as a first ingredient of the initial mixture.

3. The method according to claim 2, characterized in that the isocyanate is one of a toluene diisocyanate and a diphenylmethane-4,4-diisocyanate.

4. The method according to claim 1, characterized in that it comprises using a polyol as a second ingredient of the initial mixture.

5. The method according to claim 4, characterized in that the polyol is one of a polyether-polyol and a polyester-polyol.

6. The method according to claim 1, characterized in that it comprises using a thixotropic agent as the third ingredient to vary the viscosity of the initial mixture.

7. The method according to claim 6, characterized in that the thixotropic agent is a 2,4-bis(p-aminobenzyl)aniline.

8. The method according to claim 1, characterized in that it comprises using a catalyst as the third ingredient to vary the viscosity of the resulting mixture.

9. The method according to claim 8, characterized in that the catalyst is an organometallic compound such as a butyl-tin dilaurate.

10. The method according to claim 1, wherein the first and second protective coatings are ejected from the nozzle and applied selectively to the first and second components, respectively, by relative displacement between the nozzle and the board during the first pass.

* * * * *